United States Patent [19]
Moore et al.

[11] Patent Number: 5,120,678
[45] Date of Patent: Jun. 9, 1992

[54] ELECTRICAL COMPONENT PACKAGE COMPRISING POLYMER-REINFORCED SOLDER BUMP INTERCONNECTION

[75] Inventors: Kevin D. Moore; Steven C. Machuga, both of Schaumburg; John W. Stafford, St. Charles; Kenneth Cholewczynski, Streamwood; Dennis B. Miller, Barrington, all of Ill.

[73] Assignee: Motorola Inc., Schaumburg, Ill.

[21] Appl. No.: 609,483

[22] Filed: Nov. 5, 1990

[51] Int. Cl.⁵ ............................................. H01L 21/56
[52] U.S. Cl. ...................................... 437/183; 29/841; 228/180.2; 174/52.2; 437/211
[58] Field of Search ............... 437/209, 211, 209, 183, 437/ATD; 29/841, 832; 228/180.2; 174/52.2; 432/214

[56] References Cited

U.S. PATENT DOCUMENTS

| | | | |
|---|---|---|---|
| 4,604,644 | 8/1986 | Beckham et al. | 437/211 |
| 4,605,153 | 8/1986 | Van Den Brekel et al. | 228/180.2 |
| 4,825,284 | 4/1989 | Soga et al. | |

FOREIGN PATENT DOCUMENTS

| | | | |
|---|---|---|---|
| 23534 | 11/1981 | European Pat. Off. | 437/209 |
| 52-31673 | 3/1977 | Japan | 29/841 |
| 55-117254 | 9/1980 | Japan | 437/209 |
| 63-239826 | 10/1988 | Japan | 437/211 |
| 1-170027 | 7/1989 | Japan | 437/209 |

OTHER PUBLICATIONS

Nakano, F. et al., "Resin-Insertion Effect on Thermal Cycle Resistivity of Fkip-Chip Mounted LSI Devices", ISHM '87 Proceedings, pp. 536-541.

*Primary Examiner*—Olik Chaudhuri
*Assistant Examiner*—Andrew Griffis
*Attorney, Agent, or Firm*—Douglas D. Fekete

[57] ABSTRACT

An improved method is provided for assembling an integrated circuit component to a substrate by a solder bump interconnection that is reinforced by a polymer film. The component is attached to a region of the substrate by a plurality of solder bump interconnections that create a gap between the component interface and the substrate region. A polymer dam is applied to the region encircling the attached component spaced apart therefrom. A liquid polymer precursor material is applied to the region including the gap and is confined by the dam to prevent indiscriminate flow across the substrate. In one aspect of this invention, gas is vented from the gap through a passage in the substrate to enhance fill by the precursor liquid. In another aspect of this invention, the precursor liquid is injected into the gap through a passage in the substrate and spread outwardly therefrom. In any event, the precursor liquid infiltrates the gap about the solder interconnections and is cured to form a film that reinforces and protectively encapsulates the solder interconnections.

7 Claims, 2 Drawing Sheets

ELECTRICAL COMPONENT PACKAGE COMPRISING POLYMER-REINFORCED SOLDER BUMP INTERCONNECTION

BACKGROUND OF THE INVENTION

This invention relates to an electrical component package comprising a component mounted onto a substrate by a plurality of discrete solder bumps reinforced by a polymeric film. More particularly, this invention relates to an improved method for reinforcing a solder bump interconnection by infiltrating a gap between the component and the substrate with a liquid comprising a polymer precursor material which, upon curing, bonds the component to the substrate to reinforce the interconnection.

A typical electrical component package comprises an integrated circuit chip mounted onto a suitable carrier, which is in turn mounted onto a printed circuit board. The chip carrier has a planar interface that overlies a general planar region of the circuit board. The area of the carrier interface is relatively small in comparison to the total surface of the printed circuit board, so that the carrier attachment region of the circuit board constitutes but a minor portion of the total surface. The carrier interface comprises a plurality of discrete electrical contacts arranged in an array or other suitable pattern. The attachment region of the board also includes a plurality of electrical contacts disposed such that each contact underlies a corresponding contact on the carrier interface and is soldered thereto. The board contacts communicate with electrical signal processing features located on surrounding regions of the board and, through the several solder interconnections, conduct electrical signals to and from the integrated circuit chip for processing.

A convenient technique for mounting the chip carrier to the circuit board utilizes metallic bumps formed from microspheres of a solder alloy. A microsphere is placed onto each contact of the carrier, heated to reflow the solder and cooled, thereby forming a bump bonded to the contact. The carrier with the bumps is positioned on the circuit board region with each bump resting upon a contact on the circuit board. Following heating and cooling, the solder bonds to the circuit board contact, attaching the carrier to the circuit board and electrically connecting the contacts. The carrier interface and the circuit board are spaced apart in the product package by a gap created by the solder bumps.

The circuit board is formed of an epoxy laminant, whereas the chip carrier is composed of alumina or other suitable ceramic material. During thermal cycling such as is typically experienced by the electrical component package during operation, the epoxy laminate board and the ceramic carrier tend to expand and contract, but at different rates. This differential thermal expansion generates stresses within the solder bumps, which produce fatigue within the metal and may lead to failure of the solder bond at the electrical contact. It has been proposed to fill the gap between the electrical components with a polymeric layer in order to reinforce the assembly and reduce stresses on the solder bond during thermal cycling. However, attempts to infiltrate a solder bump interconnection on a printed circuit board with a polymer precursor liquid have not heretofore been entirely satisfactory because of the difficulty of applying the liquid to flow into and fill the gap without indiscriminately flowing across the circuit board surface.

It is an object of this invention to provide an electrical component package comprising an electrical component, such as a semiconductor chip carrier, assembled to a selected region of a substrate, such as a printed circuit board, by polymer-reinforced solder bump interconnection, wherein the reinforcing polymer film completely fills the gap between the electrical component and the printed circuit board region while being confined to said region by a preformed polymeric dam.

It is a further object of this invention to provide an improved method for assembling an electrical component to a substrate by a polymer-reinforced solder bump interconnection, wherein, following attachment of the component to the substrate by a plurality of solder bumps, a pool of polymer precursor liquid is flowed onto a region of the substrate immediately about the attached component and is confined by a dam to fill the gap created by the solder bumps. Upon curing, the resulting polymeric film reinforces the solder bump interconnection. In certain aspects of this invention wherein the polymer liquid is first applied about the component and flows into the gap, gas is evacuated or vented from the gap to promote the flow of liquid thereinto. In another aspect of this invention, polymeric liquid is injected into the gap through a passage extending through the substrate and flows outwardly thereabout to form the desired reinforcing film.

SUMMARY OF THE INVENTION

In accordance with the preferred embodiment of this invention, these and other objects are accomplished by a method for assembling an integrated circuit component, such as a ceramic carrier having a semiconductor chip mounted thereon, to a predetermined region of a relatively large substrate, such as a printed circuit board, by a polymer-reinforced solder bump interconnection. The component comprises a planar interface featuring a plurality of discrete electrical contacts arranged in an array or other suitable pattern. The substrate region is generally planar and comprises a plurality of discrete electrical contacts arranged corresponding to the component contacts. Initially, the component is attached to the substrate by a plurality of laterally discrete solder bumps. Each solder bump bonds to a selected electrical contact on said component interface and also to a corresponding contact on the substrate. In this manner, the solder bump electrically connects the contacts and affixes the component to the substrate so that the component interface overlies the substrate region in parallel, facing relationship but spaced apart by the solder bumps to create an open-perimeter gap therebetween.

Following formation of the solder bump interconnections, a bead composed of a thermally stable cured polymeric material is applied to the substrate region about the attached component to form a dam suitable for containing a liquid pool. The dam is spaced apart from the attached component to permit perimeter access to the underlying gap. In accordance with this invention, a liquid phase containing a polymeric precursor material is spread onto the region, including the gap created by the solder bumps, and is confined by the dam. A preferred material comprises an epoxy resin and a hardening agent suitable for cross-linking reaction with the epoxy resin at moderately elevated temperature to form a solid polymer film. The epoxy compound is selected for good adhesion of the cured film to the component interface and also the substrate surface. The liquid phase preferably includes a powdered inorganic filler effective to adjust the thermal expansion coefficient of the product film to approximate the thermal expansion coefficient of the solder and thereby avoid inducing stresses upon the solder bumps during thermal cycling experienced by the product package during operation.

In one aspect of this invention, a viscous bead of a thermally curable epoxy-base precursor material is applied onto the substrate region intermediate the attached component and the dam and heated to form a pod of a free-flowing liquid that spreads over the region and is drawn into the gap by capillary action. Infiltration of the gap is promoted by venting gas from the gap through a gas passage extending through the substrate and having an opening opposite the component interface. Alternately, the assembly with the precursor bead applied thereto may be heated within a vacuum chamber to evacuate gas from the gap. In either event, gas is removed from the gap to reduce resistance to the capillary flow of the liquid, thereby permiting the liquid to completely fill the gap, and avoid entrapment in the product film.

In another embodiment of this invention, polymer precursor liquid is injected directly into the gap through a passage through the substrate that opens opposite the component interface. The injected liquid fills the gap and flows outwardly therefrom to form a pool confined by the dam.

Following formation of a pool infiltrating the gap, the assembly is heated for a time and at a temperature sufficient to cure the polymer and produce a polymeric composite film that bonds the component interface to the substrate region. Thus, this invention provides an electronic component package wherein an electrical component is mounted onto a region of a substrate by a plurality of solder bumps and reinforced by a polymer composite film. The film reduces stress on the solder bumps due to differential thermal expansion of the component and the substrate during operation. In addition, the polymeric film strengthens the package to resist bending that might otherwise damage the solder bonds. Furthermore, the film encapsulates the solder bumps to protect against the corrosive effects of moisture in ambient gas.

DETAILED DESCRIPTION OF THE INVENTION

Figure 1:
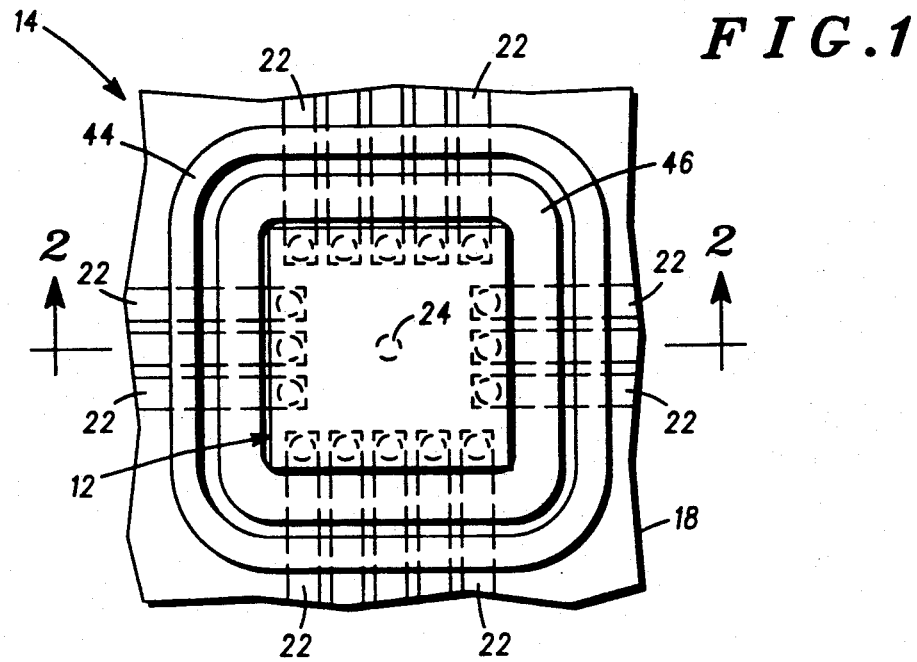
FIG. 1 is a portion of an electrical component device having multiple solder bump interconnections and adapted for polymer reinforcement in accordance with a preferred embodiment of this invention.
Figure 2:
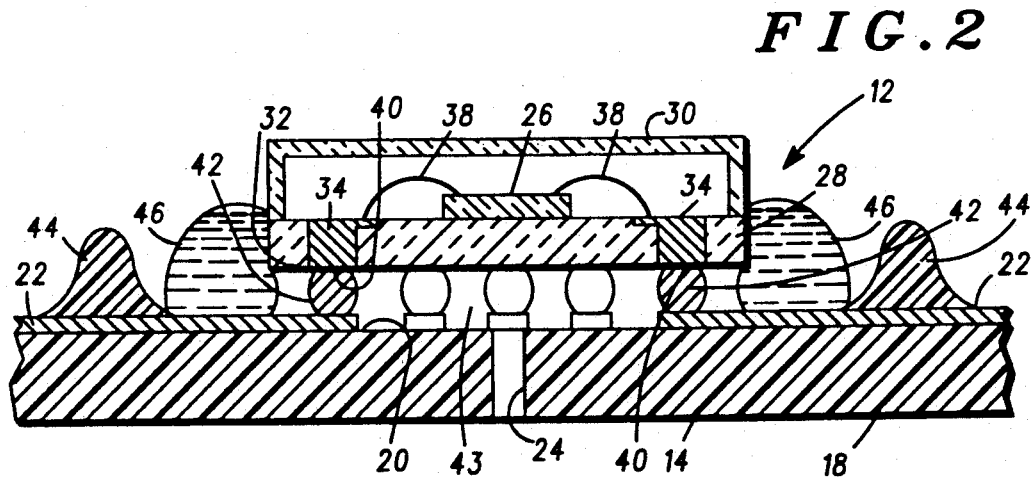
FIG. 2 is a cross-sectional view of the electrical component device in FIG. 1 taken along lines 1—1 and looking in the direction of the arrows.
Figure 3:
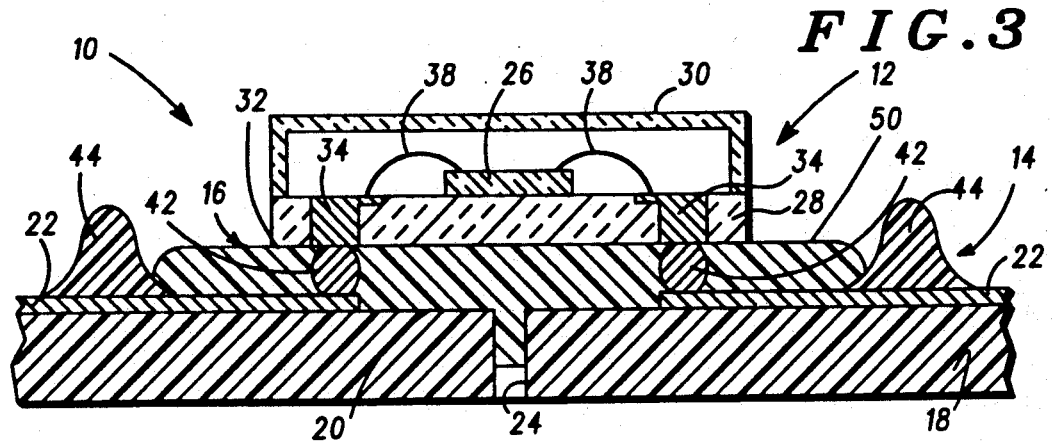
FIG. 3 is a cross-section similar to FIG. 2 showing the electrical component device following polymer reinforcement of the solder bump interconnections in accordance with the present invention.

In a first preferred embodiment, referring to FIGS. 1-3, an electrical component package produced in accordance with this invention, indicated generally at 10 in FIG. 3, comprises an integrated circuit component 12 mounted onto a printed circuit board substrate (PCB) 14 by a polymer-reinforced solder bump interconnection 16. PCB 14 comprises an FR4 board 18 formed of a laminated structure comprising glass fiber layers impregnated by an epoxy-base polymer resin. PCB 14 includes a planar region 20, depicted in the figures, adapted for mounting component 12 thereon. As is common practice, region 20 constitutes only a minor portion of the total surface area of PCB 14. Region 20 carries a plurality of clad copper electrical contacts 22 that extend beyond the region for conducting electrical signals to and from the region for processing. In accordance with this embodiment, board 18 also includes a gas passage 24 extending through the board.

Integrated circuit component 12 comprises a semiconductor chip 26 mounted onto an alumina carrier 28 and protected by cover 30. Carrier 28 includes an interface 32 opposite semiconductor chip 26 and facing PCB 14. Carrier 28 further comprises a series of metallic through-hole conductors 34. Each conductor 34 is connected to semiconductor chip 26 by a wire lead 38 and includes an electrical contact 40 at carrier interface 32. Through-conductors 34 are formed of tungsten co-fired with the surrounding alumina to form an integral structure. Contacts 40 are electroplated with a nickel-gold alloy suitable for bonding to a tin-lead solder.

In this example, through-conductors 34 are arranged in a perimeter array about carrier 28. Contacts 22 on PCB 14 are disposed in a similar pattern such that each contact 22 lies directly beneath a corresponding contact 40 and is connected by a solder bump 42.

Bumps 42 are preferably formed from microspheres of a metallic solder composed of 60 weight percent tin and 40 weight percent lead. Carrier contacts 40 are precoated with a rosin flux to promote wetting by the solder alloy. With carrier interface 32 facing up for access, a singular microsphere is placed onto each contact 40 and briefly heated to reflow the solder metal onto the contact metal. Upon cooling, the solder resolidifies to form a bump bonded to contact 40. Component 12 carrying the solder bumps is then inverted and assembled with PCB 14 such that each bump rests on the corresponding electrical contact 22. Prior to assembling, a rosin flux is coated onto the lower bump surface that rests on contact 22. The assembly is then briefly heated to reflow the solder and bond the bump to contact 22. Thus, bump 42 is fused to contact 40 and also to contact 22 to create a solder interconnection electrically and mechanically joining the contacts and thereby attaching component 12 to PCB 14. As shown in FIG. 2, the resulting soldered assembly comprises component 12 mounted onto PCB 14 with interface 32 facing and parallel to region 20 but spaced apart therefrom by bumps 42 to create a gap 43. Gap 43 is on the order of 450 microns high and features an open perimeter coextensive with the perimeter of carrier 28. Following soldering, residue from the flux is washed from carrier interface 32 and board region 20 using trichloroethylene or other suitable solvent to provide clean surfaces conducive to bonding of a polymer film.

The alumina that forms carrier 28 and the epoxy-glass laminant that forms board 18 tend to expand when subjected to elevated temperature, but at different rates. This differential thermal expansion results in stresses in the solder bonds with contacts 40 and 22, which may ultimately result in failure of the interconnection. In accordance with this invention, the solder bumps are reinforced by a polymer film 50 in FIG. 3. A continuous bead of a rapid-curing epoxy-base resin is applied to region 20 encircling component 12 and cured to form a solid dam 44. A second bead 46 of a viscous thermally curable epoxy-base precursor material is applied onto region 20 intermediate dam 44 and component 12 and generally encircling the component. A suitable material comprises a liquid phase composed of an epoxy resin and an acid anhydride hardening agent, and contains about 65 weight percent fused silica powder suitable for producing a cured film having a coefficient of thermal expansion of about $20 \times 10^{-6}$ cm/cm/°C. and a modulus of about 7000 MPa. The assembly with the polymer beads is heated to a temperature of about 150° C. During heating, the viscosity of the precursor material is reduced to create a free-flowing liquid that spreads over region 20 about component 12, forming a pool contained by dam 44, and is drawn into the gap 43 by capillary action. In accordance with this embodiment, gas is concurrently vented from gap 43 through passage 24 to reduce resistance to capillary flow of the liquid and avoid entrapment in the product film, thereby permitting the liquid to completely fill the gap. A vacuum may be applied to passage 24 at the opening opposite gap 43 to facilitate withdrawal of the gas and to assist liquid flow into the gap. Liquid is drawn into the gap at a generally uniform rate from the perimeter. Passage 24 is preferably located equidistant from the perimeter of the gap, i.e., opposite the center of interface 32, to provide optimum venting. Within the gap, the polymer liquid flows about the solder bumps 42. Upon continued heating at 150° C. for about one hour, the polymer cures to produce a solid film 50 shown in FIG. 3. Film 50 bonds to the interface 32 and board region 20 to reinforce the attachment of component 12 to PCB 14. Concurrently, the polymer forms a matrix encapsulating solder bumps 42 to protect the metal thereof against moisture that might otherwise cause corrosion. Thereafter, when package 10 is subjected to temperature fluctuations during operation, the reinforcement provided by polymer layer 50 reduces displacement of solder bumps 42 at the contacts, thereby producing a more durable interconnection.

Figure 4:
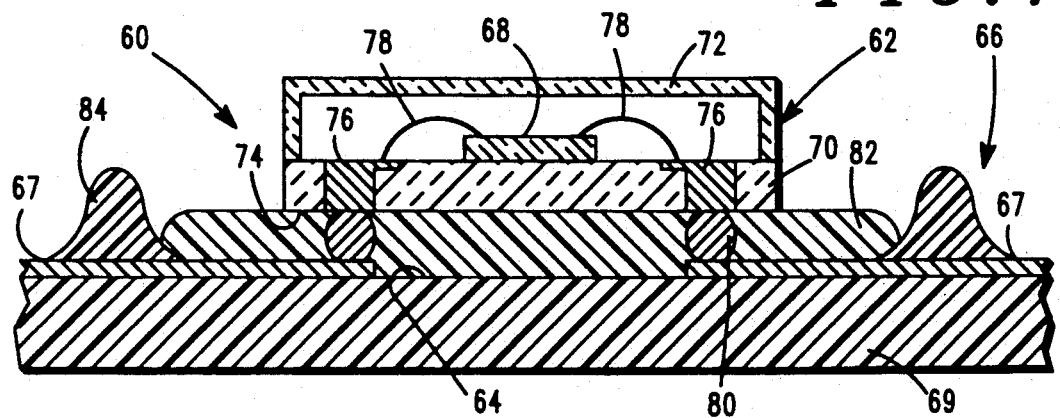
FIG. 4 is a cross-sectional view of an electrical component package having a polymer-reinforced solder bump interconnection and manufactured by an alternate embodiment of this invention.

Referring to FIG. 4, there is shown an alternate embodiment for reinforcing a solder bump interconnection with a polymer composite film, wherein the several elements are similar to like elements of FIGS. 1-3, but wherein the composite polymer film is formed without a gas passage through the printed circuit board. In FIG. 4, an electrical component package 60 comprises an integrated circuit component 62 mounted on a region 64 of a PCB substrate 66. Component 62 comprises a semiconductor chip 68 mounted on an alumina carrier 70 and protected by cover 72. Carrier 70 includes an interface 74 facing PCB 66 and a plurality of through-connectors 76 connected to chip 68 by wire bonds 78. PCB 66 comprises clad copper electrical contacts 67 disposed on an epoxy-glass laminate base 69, each such connector 67 being bonded to a through-conductor 76 at carrier interface 74 by a solder bump 80. The solder bumps 80 are reinforced and protectively encapsulated by a polymer composite film 82 surrounded by a polymeric dam 84.

In accordance with this embodiment, component 62 is initially assembled to PCB 66 by solder bumps 80 in a manner similar to the embodiment described with reference to FIGS. 1-3. A rapidly curing polymeric bead is then applied to encircle region 64 and form dam 84. A bead composed of a silica-filled epoxy-base precursor material similar to bead 46 in FIGS. 1 and 2 is applied to surface 64 within region 64 intermediate dam 84 and solder attached component 62. Within a vacuum furnace the assembly is heated, whereupon the material of the inner bead becomes a low viscosity liquid that flows onto region 64 contained by dam 84 to form a pool and is drawn into the gap between component interface 74 and region 64. Gas from within the gap escapes through the liquid pool into the surrounding vacuum to avoid entrapment in the product film 82. The polymer precursor liquid fills the gap about the solder bump interconnections 80 and, upon continued heating, cures to form layer 82 bonding component 62 to region 64 of PCB 66.

Figure 5:
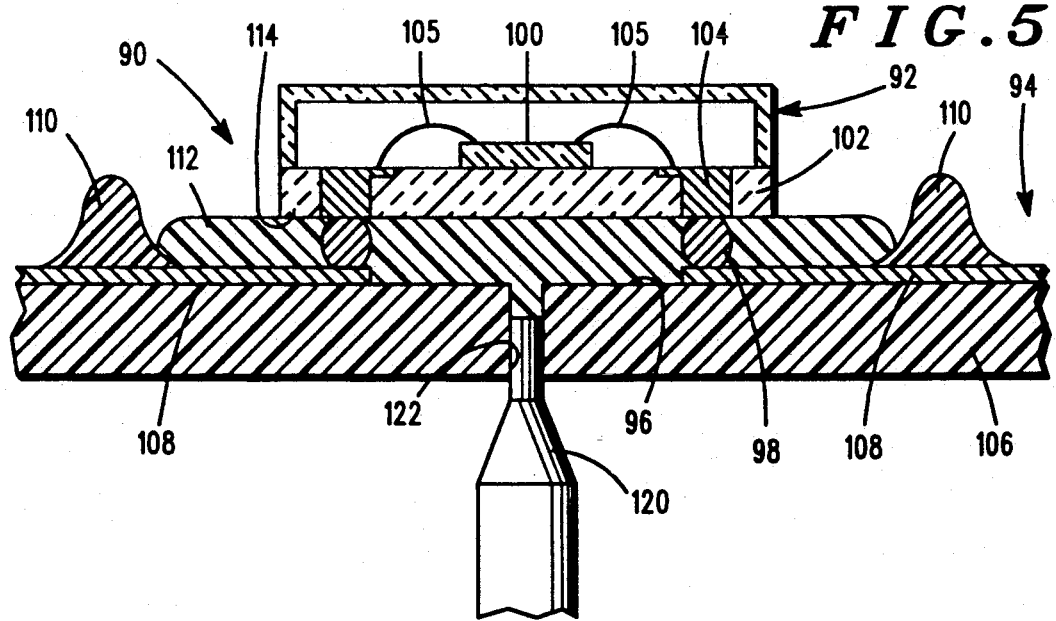
FIG. 5 is a cross-sectional view of an electrical component package having a polymer-reinforced solder bump interconnection and manufactured by still another alternate embodiment of this invention.

FIG. 5 illustrates still another alternate embodiment of this invention, wherein the several elements are similar to like elements in FIGS. 1-3, but wherein the gap is filled by injecting liquid polymer percursor material through a passage in the printed circuit board. An electrical component package 90 in accordance with this embodiment comprises an electrical component 92 bonded to a surface region 96 of a PCB 94 by solder bumps 98. Component 92 comprises a semiconductor chip 100 mounted on a alumina carrier 102 and connected to through-conductors 104 by wire leads 105. PCB 94 includes an epoxy-glass laminate base 106 having deposited thereon electrical contacts 108. Solder bumps 98 interconnect carrier through-conductors 104 to contacts 108 on PCB 94 and are formed in a manner described with respect to bumps 42 in FIGS. 1-3. Solder bumps 98 are reinforced by an epoxy-base polymer composite film 112 that extends between carrier interface 114 and region 96 confined by a polymeric dam 110. In accordance with this embodiment, following solder attachment of component 92 onto board 94, dam 110 is applied to encirle region 96 similar to dam 44 in FIG. 1-3. Thereafter, liquid polymer precursor material is dispensed into the gap between carrier interface 114 and PCB region 96 through a passage 122 in substrate 106 using an injection 120. The precursor liquid fills the gap and flows outwardly from about the perimeter of component 92, but is eventually contained by dam 110. Thus, the polymer percursor liquid forms a pool that spreads over region 96 of PCB 94, including within the gap created by bumps 98. Upon continued heating, the liquid cures to form solid layer 112 that reinforces and protectively encapsulates solder bumps 98.

Although this invention has been described particularly for reinforcing a solder bumps interconnection between a semiconductor chip carrier and a printed circuit board, it may be adapted to reinforce any suitable solder bump interconnection between an integrated circuit component and a substrate wherein the solder bumps create a gap between the interface of the component and the underlying region of the substrate. For example, the polymer film may be formed to reinforce the solder bump interconnection formed by a flip-chip technique between a semiconductor chip and a substrate which may be a ceramic carrier similar to carrier 28 in FIGS. 1-3 or an epoxy-base polymer substrate. The solder interconnections may be formed by microspheres as in the described embodiments, or by any suitable process, including selective plating or solder transfer from a preplated web. The dam may be formed of any suitable polymer that adheres to the substrate to produce a barrier to the precursor liquid and may be removed following curing of the polymer film. In general, epoxy-base polymer formulations are readily available that may be conveniently applied as a bead onto an epoxy base or a ceramic substrate and readily cured under ambient conditions. With respect in particular to those embodiments of this inventon wherein polymer precursor liquid is disposed onto the region about the attached component, the bead for the dam is dispensed in sufficient thickness to assure a height adequate for containing the liquid volume prior infiltration of the gap.

The solder bump interconnection may be reinforced using any suitable thermoset polymer that may be applied as a liquid to infiltrate the gap and cured to bond the component to the substrate. The epoxy-base polymers bond with good adhesion to a variety of disimilar materials, including ceramic and epoxy-base materials, and are particularly well suited for reinforcing solder bumps of an electrical component package. The epoxy-base precursor material in the described embodiment was a viscous liquid at ambient temperature and formed a free-flowing liquid upon heating. This permitted the precursor material to be applied as a bead and to complete infiltration prior to curing. It is desired that the product film have a coefficient of thermal expansion comparable to the solder metal to minimize lateral forces on the bumps during thermal cycling. In general, coefficients of thermal expansion between about $18 \times 10^{-6}$ cm/cm/° C. and $40 \times 10^{-6}$ cm/cm/° C. are compatible with typical solder bump alloys. A suitable coefficient of thermal expansion may be obtained by incorporating a ceramic filler, such as fused silica in the described embodiments, into the polymer film. This is suitably accomplished by adding a powder to the precursor material. Because filler additions tend to increase the viscosity of the precursor liquid, the proportion of filler is not made so great as to inhibit the flow of liquid into the narrow gap.

While this invention has been described in terms of certain embodiments thereof, it is not intended that it be limited to the above description but rather only to the extent set forth in the claims that follow.

What is claimed is:

1. A method for assembling an integrated circuit chip carrier to a printed circuit board by polymer-reinforced solder bump interconnection, said chip carrier having a planar interface comprising a plurality of discrete electrical contacts, said circuit board having a chip carrier attachment region bearing a plurality of discrete electrical contacts arranged corresponding to the circuit board contacts, said method comprising attaching the chip carrier to the circuit board by a pluraltiy of solder bumps, each said bump bonding to a said chip carrier electrical contact and to a said circuit board electrical contact to electrical connect the contacts and to affix the chip carrier to the circuit board such that the carrier interface overlies the board region in parallel, facing relationship spaced apart by the solder bumps to create an open-perimeter gap therebetween, applying to the circuit board region a polymer dam for containing a liquid pool, said dam being disposed to encircle the attached chip carrier laterally spaced therefrom, applying a bead of a viscous polymer precursor material onto the ciccuit board regtion intermediate the dam and the attached chip carrier, heating the polymer percursor material to form a free-flowing liquid pool contained by sid dam about said attached chip carrier, whereupon the precursor liquid infiltrates the gap and flows about the solder bumps, and curing the polymer precursor material to form a solid polymer film extending within the gap to bond the chip carrier interface to the circuit board region to reinforce and protectively encapsulate the solder bumps.

2. A method for assembling an integrated circuit chip carrier to a printed circuit board by polymer-reinforced solder bump interconnection, said chip carrier having a planar interface comprising a plurality of discrete electrical contacts disposed in a suitable pattern, said circuit board having a chip attachment region bearing a plurality of electrical contacts disposed corresponding to said chip carrier contacts, said method comprising attaching the carrier to the circuit board by a plurality of solder bumps, each said bump bonding to a said chip carrier electrical contact and to a said circuit board electrical contact to electrical connect the contacts and to affix the chip carrier to the board such that the carrier interface overlies the board region in parallel, facing relationship spaced apart by the solder bumps to create an open-perimeter gap therebetween, applying to the circuit board region a polymer dam for containing a liquid pool, said dam being disposed to encircle the attached chip carrier laterally spaced therefrom, applying to the circuit board region a bead of a viscous thermally curable epoxy-base polymer precursor material, said polymer bead being applied onto the circuit board region intermediate the dam and the attached chip carrier, heating the polymer precursor material to form a free-flowing liquid that spreads onto the region contained by said dam and flows into the gap between the chip carrier interface and the circuit board region, whereupon the precursor liquid flows about the solder bumps to fill the gap, and further heating the polymer precursor material to cure the material to form a solid polymer film extending within the gap to bond the chip carrier interface to the circuit board region to reinforce and protectively encapsulate the solder bumps.

3. The method according to claim 2 further comprising venting gas from said gap concurrent with the flow of polymer precursor liquid thereinto, said gas being vented through a passage extending through the circuit board and opening opposite the chip carrier interface.

4. The method of claim 2 further comprising evacuating gas from said gap into an ambient vacuum to enhance the flow of precursor liquid into the gap.

5. A method for assembling an integrated circuit chip carrier to a printed circuit board by polymer-reinforced solder bump interconnection, said chip carrier having a planar interface comprising a plurality of discrete electrical contacts disposed in a suitable pattern, said circuit board having a chip attachment region bearing a plurality of electrical contacts disposed corresponding to said chip carrier contacts, said method comprising attaching the chip carrier to the circuit board by a plurality of solder bumps, each said bump bonding to a said chip carrier electrical contact and to a said circuit board electrical contact to electrical connect the contacts and to affix the chip carrier to the board such that the carrier interface overlies the board region in parallel, facing relationship spaced apart by the solder bumps to create a gap therebetween, applying to the circuit board region a polymer dam for containing a liquid pool, said dam being disposed to encircle the attached chip carrier laterally spaced therefrom, injecting a thermally curable epoxy-base polymer precursor liquid material into the gap through a passage extending through the circuit board and having an outlet opposite the chip carrier interface, whereupon the liquid fills the gap and flows outward therefrom to form a pool contained by the dam, and heating the polymer precursor material to cure the material to form a solid polymer film extending within the gap to bond the chip carrier interface to the circuit board region to reinforce and protectively encapsulate the solder bumps.

6. A method for assembling an intergrated ciruit component to a substrate by polymer-reinforced solder bump interconnection, said component having a generally planar interface comprising a plurality of discrete electrical contacts, said substrate having a generally planar interface bearing a plurality of discrete electrical contacts arranged corresponding to the component contacts, said method comprising attaching the component to the substrate by a plurality of solder bumps, each said bump bonding to a said component contact and to a said substrate contact to electrical connect the contacts and to affix the component to the substrate such that the component interface overlies the substrate interface spaced apart by the solder bumps to create a gap therebetween, applying a dam to the substrate for containing a liquid pool, said dam being disposed to encircle the attached component laterally spaced therefrom, applying a bead of a viscous polymer precursor material onto the substrate intermediate the dam and the attached component, heating the polymer precursor material to form a free-flowing liquid contained by said dam about said attached component, whereupon the liquid infiltrates the gap and flows about the solder bumps, and curing the polymer precursor material to form a solid polymer film extending within the gap to bond the component interface to the substrate interface to reinforce and protectively encapsulate the solder bumps.

7. The method according to claim 6 wherein the substrate is a printed circuit board.

* * * * *